United States Patent
Yao et al.

(10) Patent No.: US 7,712,943 B2
(45) Date of Patent: May 11, 2010

(54) BACKLIGHT MODULE WITH LIGHT SOURCE SUBSTRATE BLOCKS

(75) Inventors: Yen-Chang Yao, Miao-Li (TW); Hsiang-Hui Hsieh, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 0 days.

(21) Appl. No.: 12/220,195

(22) Filed: Jul. 21, 2008

(65) Prior Publication Data
US 2009/0021961 A1     Jan. 22, 2009

(30) Foreign Application Priority Data
Jul. 20, 2007    (TW)    ................... 96126529

(51) Int. Cl.
*F21V 7/04*    (2006.01)
(52) U.S. Cl. .................. 362/612; 362/628; 362/633
(58) Field of Classification Search ........... 362/237, 362/240, 241, 249.02, 249.06, 249.14, 608, 362/612, 613, 628, 631, 632, 633, 634
See application file for complete search history.

(56) References Cited
U.S. PATENT DOCUMENTS

| | | | | |
|---|---|---|---|---|
| 4,941,072 A | * | 7/1990 | Yasumoto et al. | ...... 362/249.06 |
| 7,306,357 B2 | * | 12/2007 | Han et al. | ................... 362/628 |
| 7,455,441 B2 | * | 11/2008 | Chosa et al. | ................. 362/608 |
| 2004/0240249 A1 | | 12/2004 | Kuzuno et al. | |
| 2005/0211992 A1 | | 9/2005 | Nomura et al. | |
| 2007/0008739 A1 | * | 1/2007 | Kim et al. | ................... 362/612 |
| 2007/0109792 A1 | | 5/2007 | Chosa et al. | |

FOREIGN PATENT DOCUMENTS

| | | |
|---|---|---|
| CN | 1846318 A | 10/2006 |
| JP | 2004288386 A | 10/2004 |

* cited by examiner

*Primary Examiner*—Y My Quach Lee
(74) *Attorney, Agent, or Firm*—Wei Te Chung

(57) ABSTRACT

An exemplary backlight module includes a light source, a light guide panel, and a frame. The light source includes a substrate, blocks disposed on the substrate and spaced from each other, and light emitting diodes (LEDs) each including a first electrode, a second electrode, a chip and a bonding wire. The first and second electrodes are arranged on the substrate between two blocks, and are electrically connected to each other via the chip and the bonding wire. The light guide panel transforms linear light to planar light. The frame receives the light source. Each of two adjacent corners of the frame are step-shaped or wedge-shaped, with two ends of the light source correspondingly cut into step or wedge shapes to engage the frame.

4 Claims, 15 Drawing Sheets

BACKLIGHT MODULE WITH LIGHT SOURCE SUBSTRATE BLOCKS

FIELD OF THE INVENTION

The present invention relates to light sources, and particularly to a light source using light emitting diodes (LEDs), a backlight module using the light source, and a method for manufacturing the light source.

GENERAL BACKGROUND

Liquid crystal displays (LCDs) are commonly used for compact electronic apparatuses. Because the liquid crystal in an LCD does not emit any light itself, the liquid crystal requires supplementary light for clear and sharp display. Therefore a typical LCD utilizes an accompanying backlight which includes a light source, to ensure sufficient, uniform brightness.

Referring to FIG. 20, a typical light source 10 generally applied to a side backlight module includes a substrate 11 and a plurality of LEDs 12. A plurality of wiring lines (not shown) and soldering points 13 are arranged on the substrate 11.

Referring to FIG. 21, each LED 12 includes a base 121, a chip 122, a bonding wire 123, a first electrode 124, a second electrode 125, a first pin 126, a second pin 127, and a sealant 128. The base 121 includes an upper surface 1211 and a lower surface 1212. The first electrode 124 and the second electrode 125 are arranged at the upper surface 1211. The chip 122 is disposed at the first electrode 124 and electrically connected to the first electrode 124. The chip 122 is further electrically connected to the second electrode 125 via the bonding wire 123. The first and second pins 126, 127 extend through the base 121 and are connected to the first and second electrodes 124, 125 respectively.

Sealant 128 covers the base 121 to form a closed space (not labeled). The closed space accommodates the chip 122, the bonding wire 123, and the first and second electrodes 124, 125. The first and second pins 126, 127 are soldered to two soldering points 13 on the substrate 11 respectively. Thus, an external power source (not shown) can provide electrical power to light the LEDs 12.

During manufacture of the light source 10, the substrate 11 and the LEDs 12 are produced independently. Thereafter, the LEDs 12 are mounted to the substrate 11 by surface mount technology (SMT). Manufacture of the soldering points 13 and the process of soldering the LEDs 12 to the soldering points 13 are, however, complicated and time-consuming. Moreover, structure of the light source 10 is complicated.

What is needed, therefore, is a light source that can overcome the limitations described.

SUMMARY

In an exemplary embodiment, backlight module includes a light source, a light guide panel, and a frame. The light source includes a substrate, a plurality of blocks disposed on the substrate and spaced from each other, and a plurality of light emitting diodes (LEDs) each including a first electrode, a second electrode, a chip and a bonding wire. The first and second electrodes are arranged on the substrate between two blocks, and are electrically connected to each other via the chip and the bonding wire. The light guide panel transforms linear light to planar light. The frame receives the light source therein. Each of two adjacent corners of the frame is step-shaped or wedge-shaped, with two ends of the light source correspondingly cut into step or wedge shapes to engage the frame.

Other novel features and advantages of the present light source will become more apparent from the following detailed description when taken in conjunction with the accompanying drawings. In the drawings, all the views are schematic.

DETAILED DESCRIPTION OF CERTAIN INVENTIVE EMBODIMENTS

Figure 1:
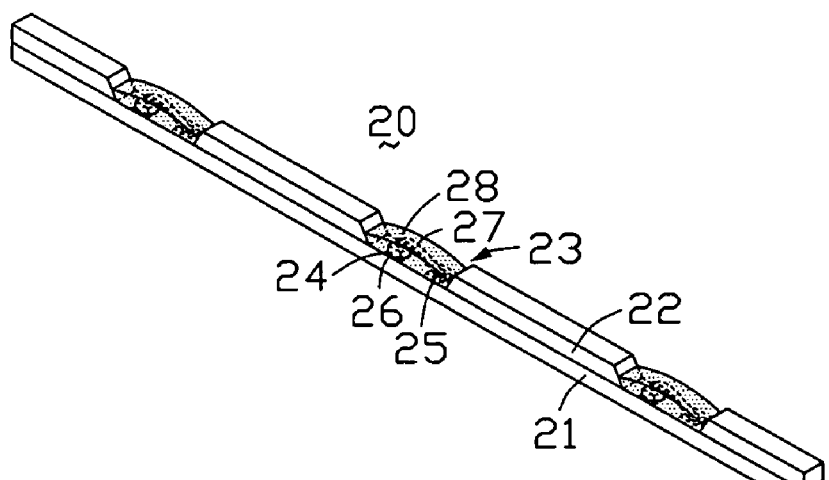
FIG. 1 is an isometric view of a light source according to a first embodiment of the present invention.

Reference will now be made to the drawing figures to describe various embodiments of the present invention in detail.

Referring to FIG. 1, an isometric view of a light source 20 according to a first embodiment of the present invention is shown. The light source 20 includes a substrate 21, a plurality of blocks 22, and a plurality of light emitting diodes 23.

The light source 20 is a linear light source. The substrate 21 is longitudinal. A plurality of wiring lines (not shown) is arranged on the substrate 21. The blocks 22 are spaced a predetermined distance apart from each other. Each LED 23 is disposed on the substrate in a space between two adjacent blocks 22.

Each block 22 has a trapezoid cross-section along the longitudinal axis. A reflective layer (not labeled) is coated on each angled side of the block 22. The reflective layer reflects light emitted from the LEDs 23 to increase light utilization efficiency.

The LED 23 includes a first electrode 24, a second electrode 25, a chip 26, a bonding wire 27, and a sealant 28. The first and second electrodes 24, 25 are arranged on the substrate 21. The chip 26 is disposed at the first electrode 24, so that the chip 26 is electrically connected to the first electrode 26. The chip 26 is connected to the second electrode 25 via the bonding wire 27. The two electrodes 24, 25 are connected to wiring lines in the substrate 21, providing power to the LEDs 22 accordingly. The sealant 28 covers the chip 26, the bonding wire 27, and two electrodes 24, 25. The sealant 28 is epoxy resin mixed with fluorescent powder.

Unlike conventional light sources, the LEDs 23 of the light source 20 need neither bases nor pins, and are formed directly on the substrate 21. Thus, the light source 20 has a simplified structure. Moreover, the light source 20 has a plurality of trapezoidal blocks 22 reflecting light emitted from the LEDs 23. Thus, the light source 20 provides efficient light utilization. Furthermore, a base for the LED encapsulation is omitted, reducing bulk of the light source 20.

Figure 2:
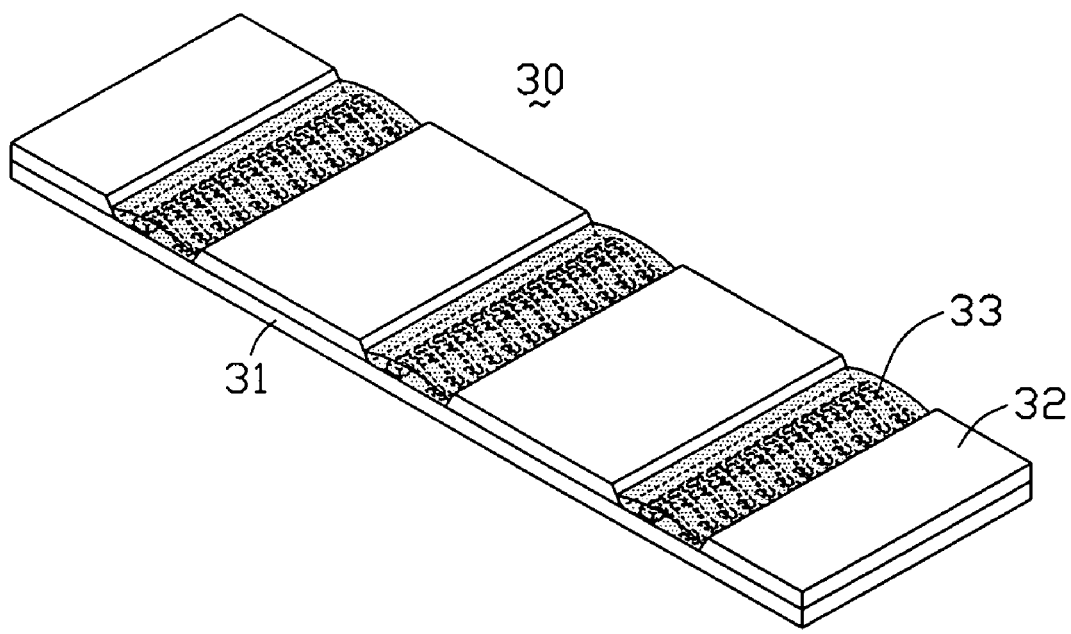
FIG. 2 is an isometric view of a light source according to a second embodiment of the present invention.

Referring to FIG. 2, a light source according to a second embodiment is similar to the light source 20, differing only in that the light source 30 is a planar light source. A substrate 31 is rectangular. A column of LEDs 33 is arranged between every two adjacent blocks 32.

Figure 3:
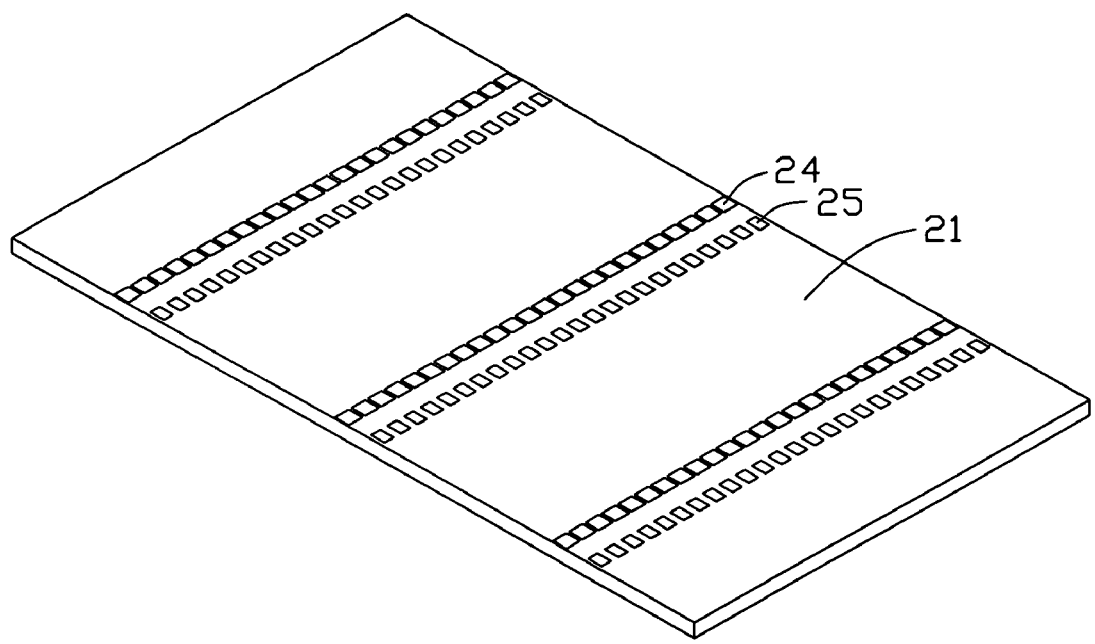
FIGS. 3-10 are isometric views illustrating a method for manufacturing the light sources of FIG. 1 and FIG. 2, FIG. 3 showing a substrate having pairs of electrodes, FIG. 4 showing the substrate on which a plurality of blocks are formed, FIG. 5 showing formation of a plurality of LEDs on the substrate, FIG. 6 being an enlarged view of part of FIG. 5, FIG. 7 showing deposition of a sealant on each LED, FIG. 8 being an enlarged view of part of FIG. 7, FIG. 9 showing a linear light source, and FIG. 10 showing a planar light source produced by the disclosed method.
Figure 4:
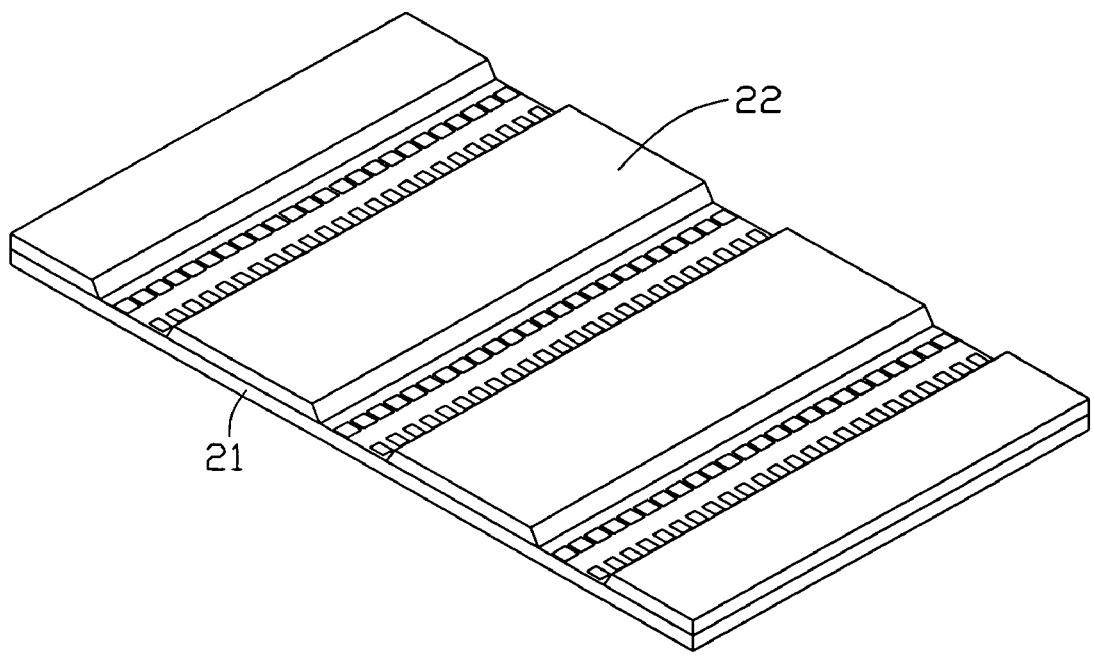
Figure 5:
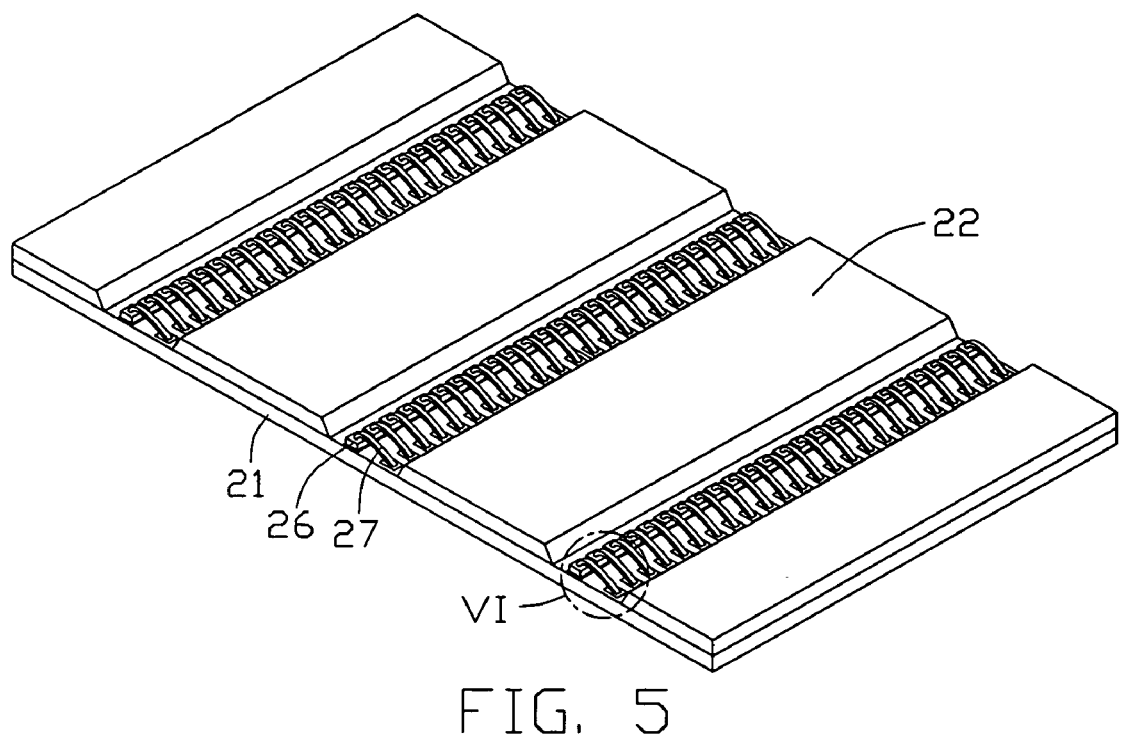
Figure 6:
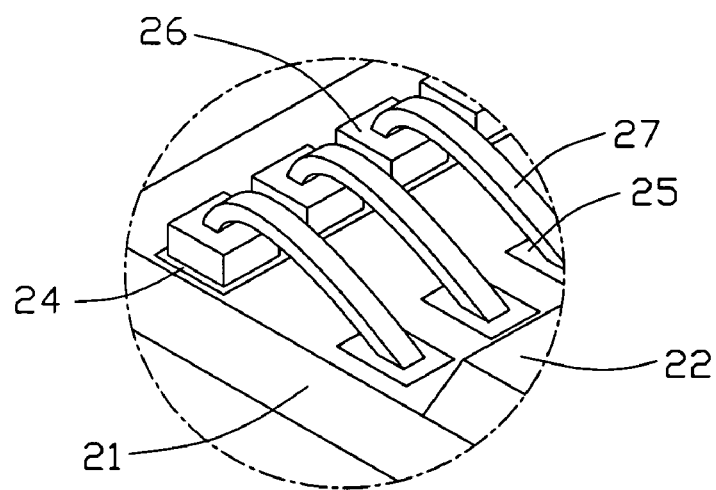
Figure 7:
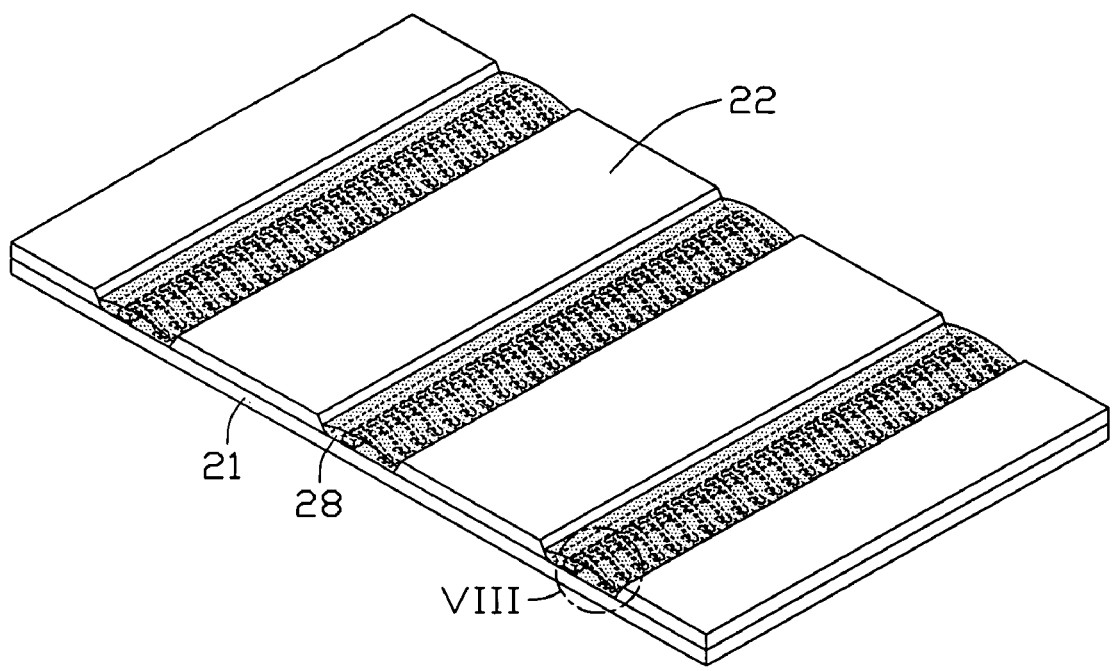
Figure 8:
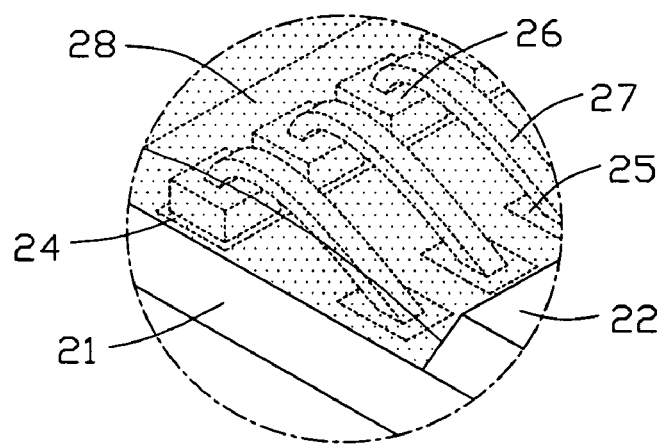
Figure 9:
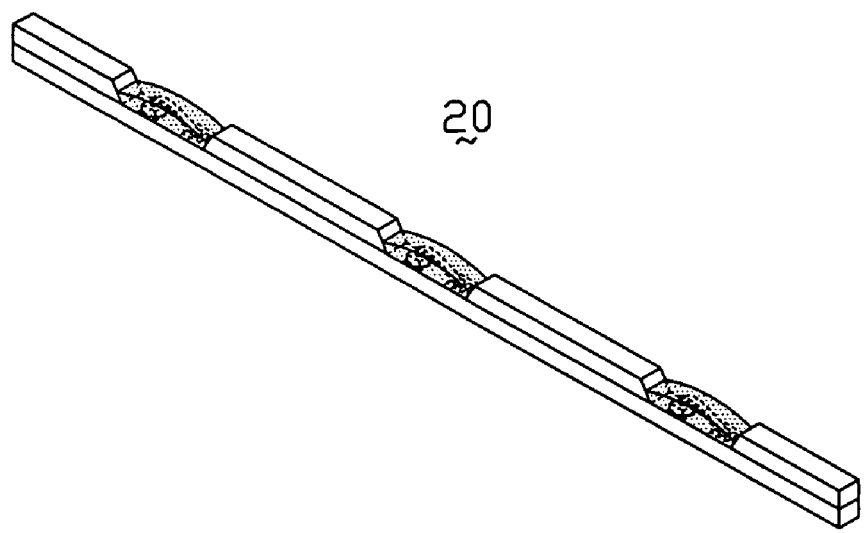

FIGS. 3-10 are isometric views illustrating exemplary methods for manufacturing the light sources 20, 30. The methods include manufacturing the substrate as shown in FIG. 3, forming the blocks as shown in FIG. 4, fixing the LEDs as shown in FIGS. 5-6, sealing the sealant as shown in FIGS. 7-8, and scribing a planar light source into a plurality of linear light sources as shown in FIG. 9. For simplicity, subsequent description utilizes terms that relate to the light source 20.

Referring to FIG. 3, a rectangular substrate 21 is provided. A plurality of wiring lines (not shown), a plurality of pairs of first electrodes 24 and corresponding second electrodes 25 are formed on the substrate 21. The wiring lines connect the first and second electrodes 24, 25 to an external power source (not shown). The wiring lines can be serial or parallel. Each pair of first and second electrodes 24, 25 is spaced a predetermined distance apart from another adjacent pair of first and second electrodes 24, 25. A distance between a first electrode 24 and a corresponding second electrode 25 is less than the space distance between every two adjacent pairs of the first and second electrodes 24, 25.

Referring to FIG. 4, a plurality of blocks 22 are disposed on the substrate 21 corresponding to the spaces between pairs of first and second electrodes 24, 25. Each of the blocks 22 has a trapezoidal cross-section. Reflective layers (not shown) are coated on each angled side of the blocks 22 respectively.

Referring to FIGS. 5-6, chips 26 are encapsulated on the first electrodes 24 with soldering materials such as silver sealant, and each chip 26 corresponds to one first electrode 24. A bonding wire 27 is disposed to connect each chip 26 to a corresponding second electrode 25.

Referring to FIGS. 7-8, epoxy resin sealants 28 mixed with fluorescent powder cover the first and second electrodes 24, 25, the chips 26, and the bonding wires 27. The first and second electrodes 24, 25, the chips 26, and the bonding wires 27 arranged in the same column are encapsulated simultaneously.

Figure 10:
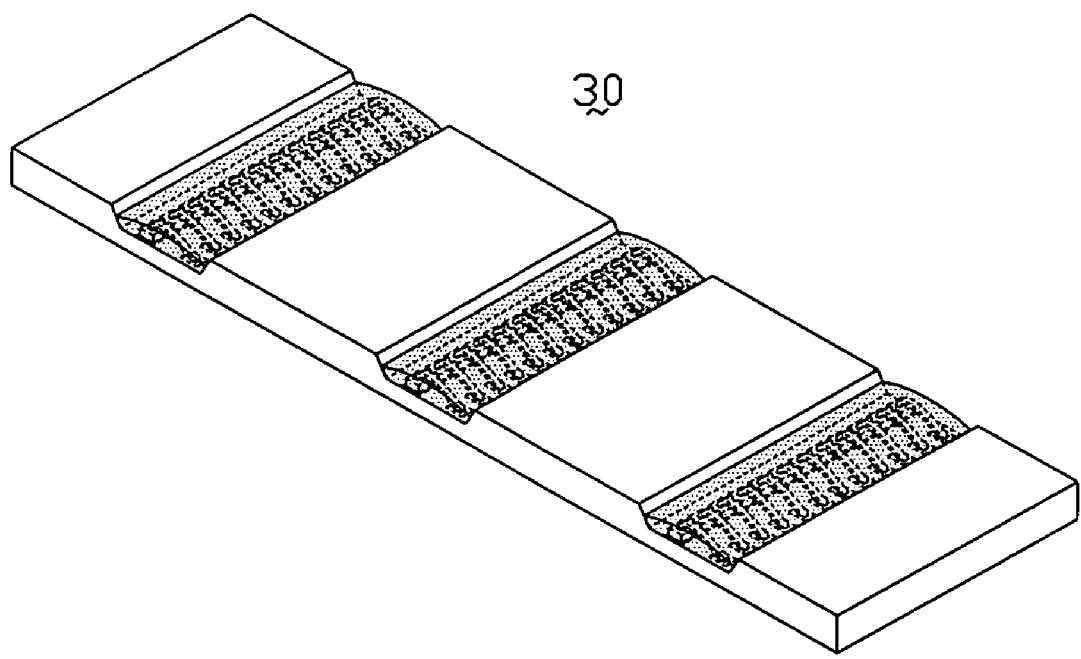

Referring to FIGS. 9-10, the substrate 21 is separated into linear light sources 20 or planar light sources 30 according to need. The entire substrate 21 can also act as a large planar light source 30.

Unlike conventional methods for manufacturing the light sources, during manufacture of the light source 20 or 30, the first and second electrodes 24, 25 of the LEDs 23 are directly formed on the substrate 21. The first and second electrodes 24, 25 are electrically connected via the chips 26 and the bonding wires 27. Thus, it is not necessary to provide soldering points for the LEDs 23, simplifying the manufacturing process and conserving time.

Further and/or alternative embodiments of the light sources of the present invention follow. The blocks 22 can also have a rectangular or triangular cross-section, and can further be of materials with high reflectance, such as aluminum or silver rather than coating reflective layers.

Figure 11:
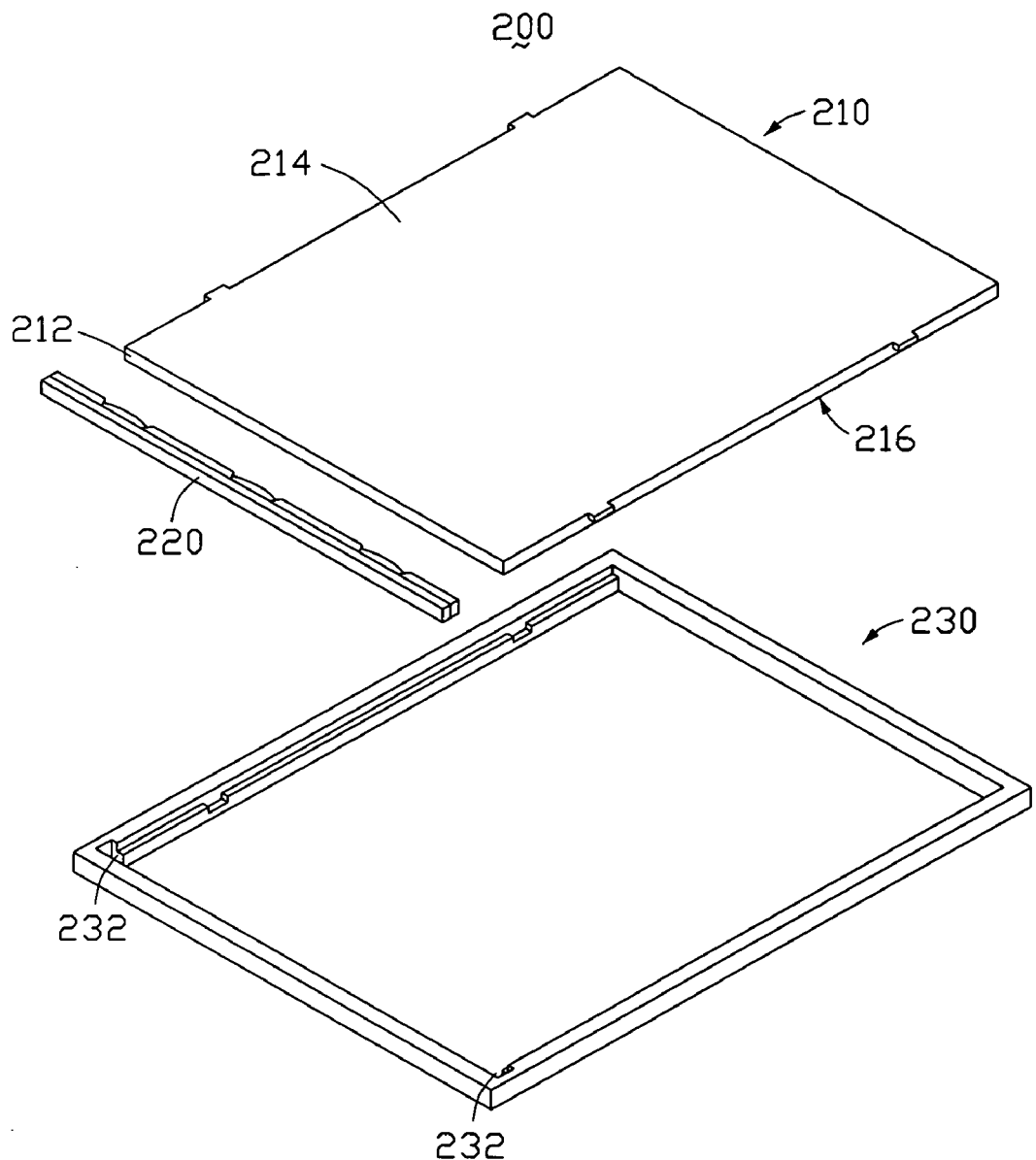
FIG. 11 is an isometric, exploded view of a backlight module according to a first embodiment of the present invention.
Figure 12:
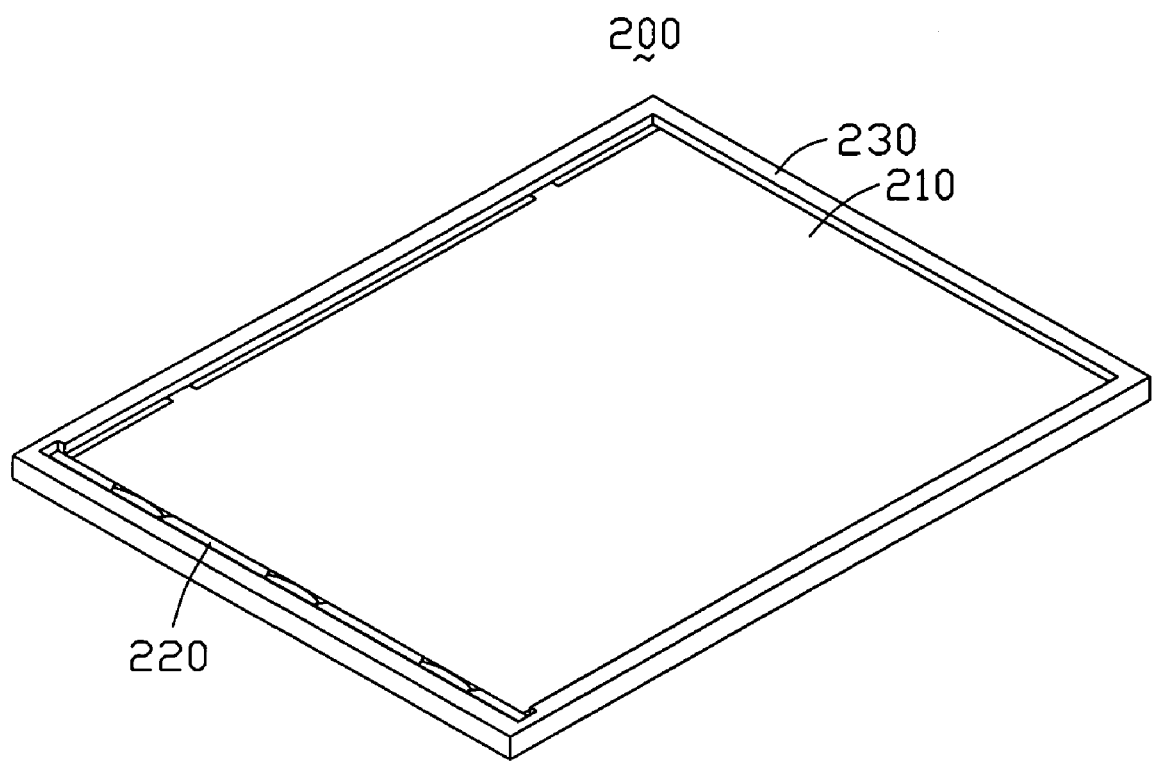
FIG. 12 is an assembled view of the backlight module of FIG. 11.

Referring to FIGS. 11-12, a side backlight module 200 includes a light guide panel 210, a light source 220, and a frame 230 receiving the light guide panel 210 and the light source 220. The light source 220 has the same structure as light source 20. The light guide panel 210 includes a light incident surface 212, a light emitting surface 214 adjacent to the light incident surface 212, and a bottom surface 216 opposite to the light emitting surface 214. The light source 220 is disposed adjacent to the light incident surface 212. The frame 230 includes two grooves 232 at two adjacent corners thereof. Two ends of the light source 220 are engaged with the grooves 232 so that the frame receives the light source 220.

Figure 13:
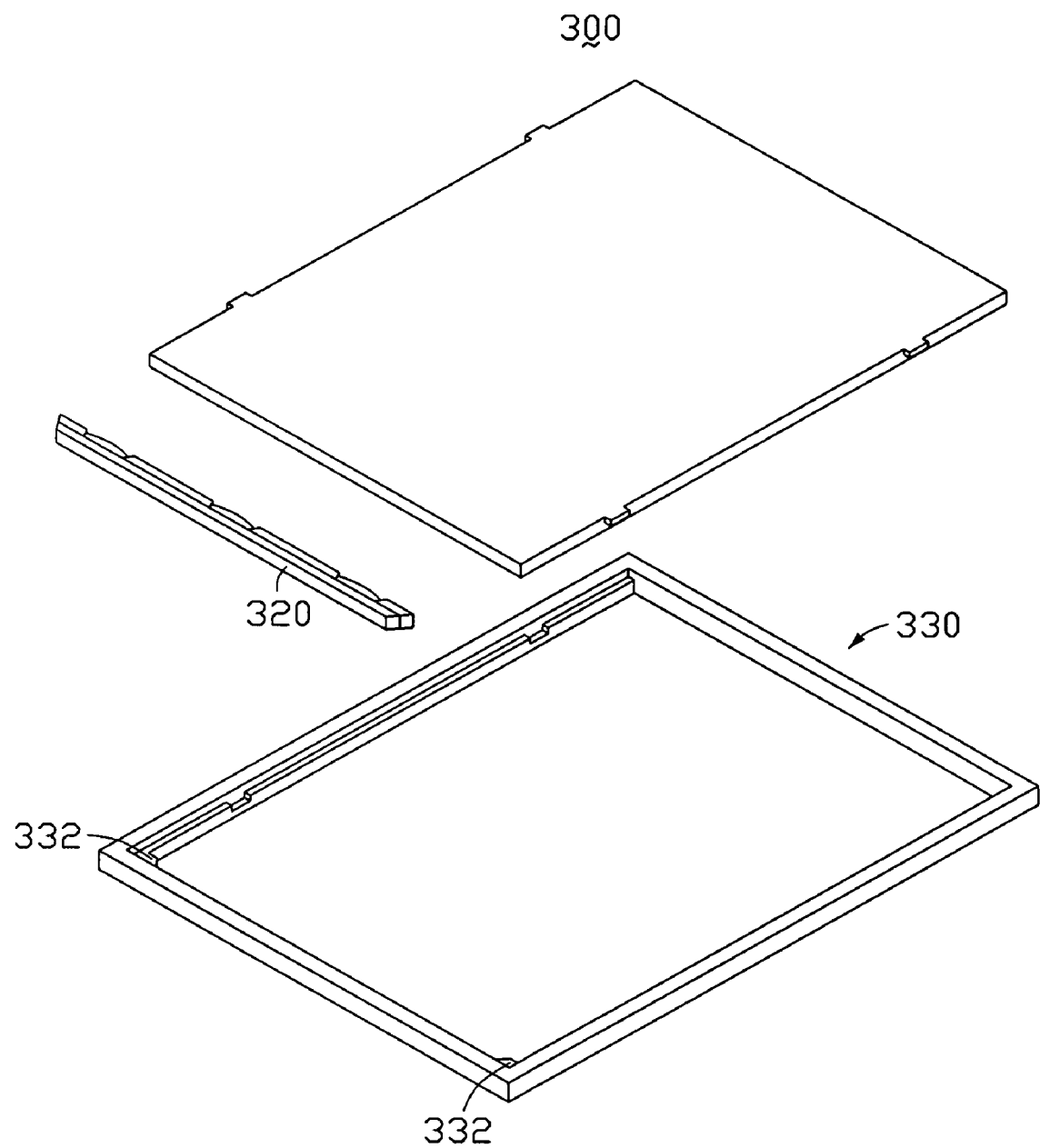
FIG. 13 is similar to FIG. 11, but shows an isometric, exploded view of a backlight module according to a second embodiment of the present invention.

Referring to FIG. 13, a backlight module 300 according to a second embodiment of the present invention is similar to the backlight module 200, differing only in that the two ends of a light source 320 are cut to be wedge-shaped. Correspondingly, two adjacent corners of a frame 330 have wedge-shaped blocks 332 to engage the light source 320.

Figure 14:
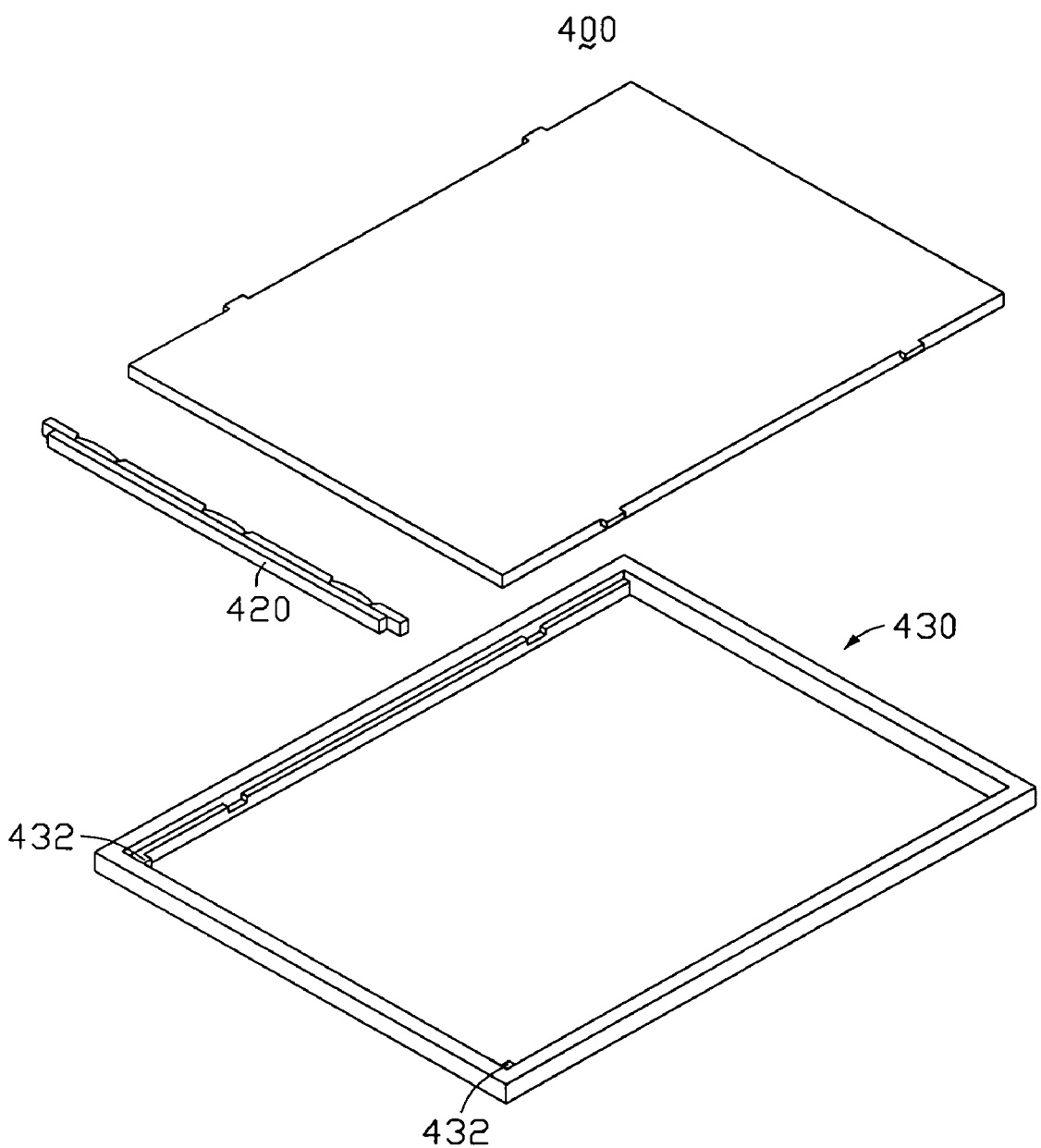
FIG. 14 is similar to FIG. 11, but shows an isometric, exploded view of a backlight module according to a third embodiment of the present invention.

Referring to FIG. 14, a backlight module 400 according to a third embodiment of the present invention is similar to the backlight module 200, differing only in that the two ends of a light source 420 are cut to be step-shaped. Correspondingly, two adjacent corners of a frame 430 have step-shaped blocks 432 to engage the light source 430.

Figure 15:
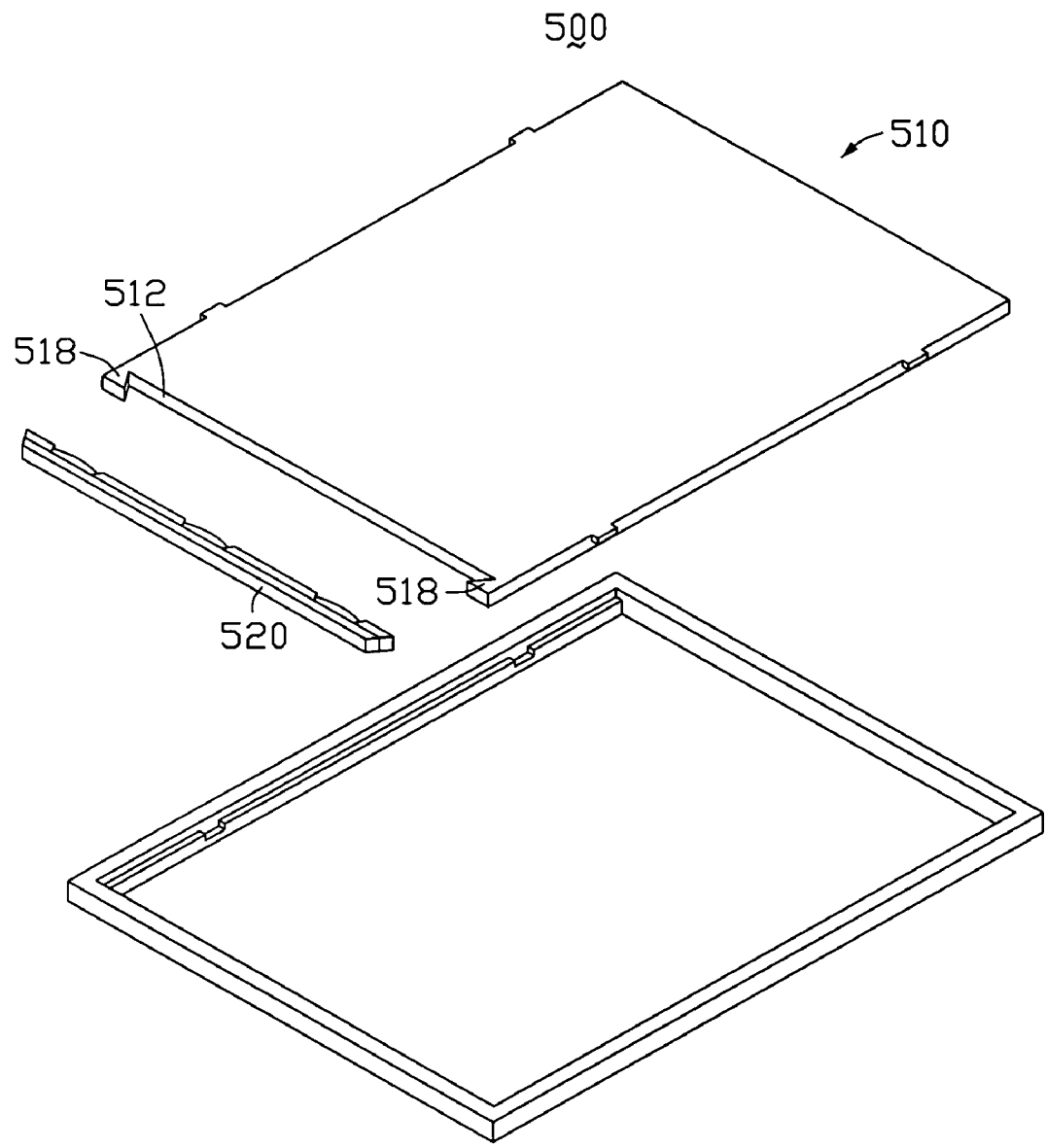
FIG. 15 is similar to FIG. 11, but shows an isometric, exploded view of a backlight module according to a fourth embodiment of the present invention.

Referring to FIG. 15, a backlight module 500 according to a fourth embodiment of the present invention is similar to the backlight module 200, differing only in that two ends of a light source 520 are cut to a wedge shape. Correspondingly, each end of a light incident surface 512 of a light guide panel 510 extends a wedge-shaped block 518 to engage the light source 520.

Figure 16:
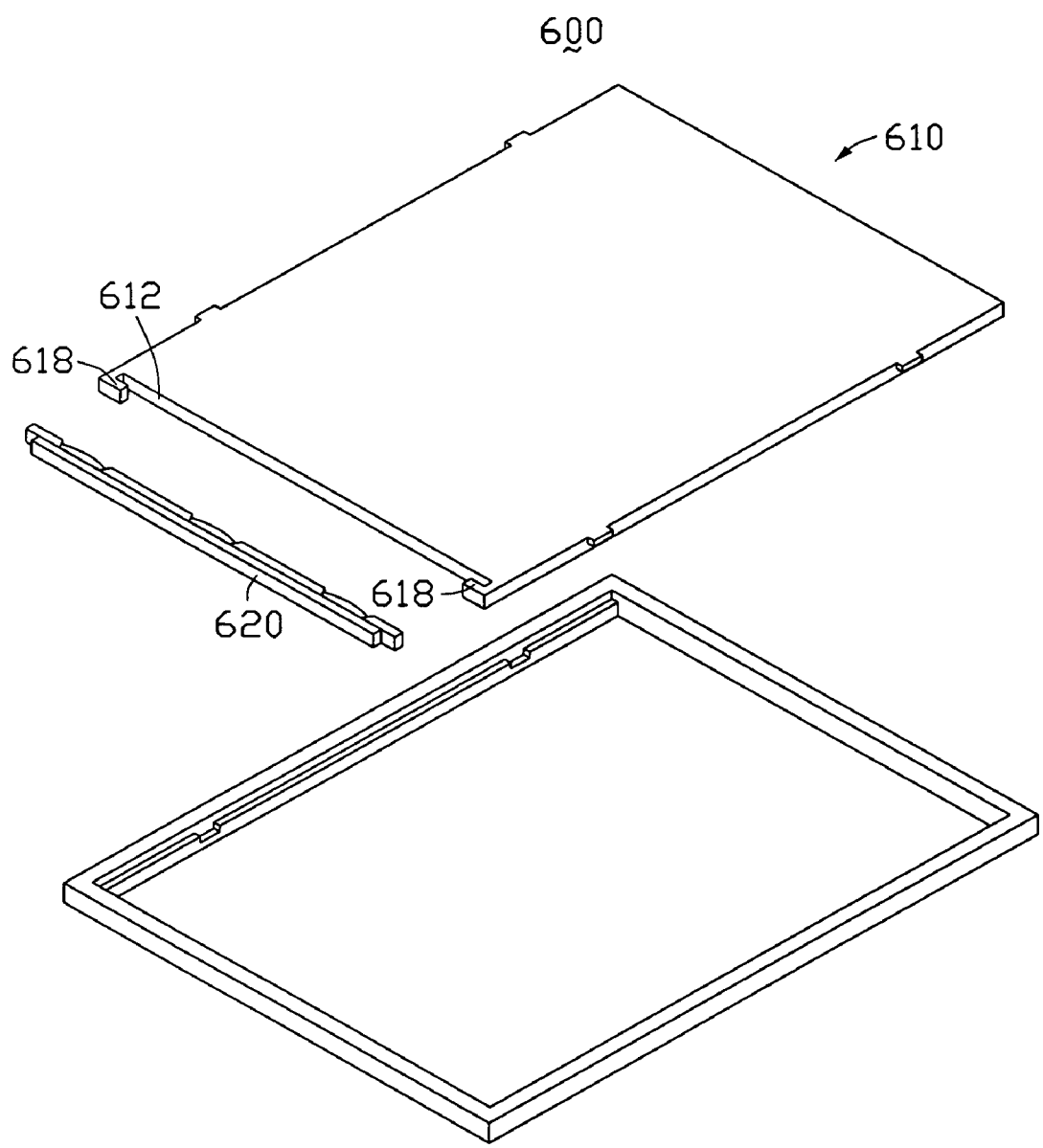
FIG. 16 is similar to FIG. 11, but shows an isometric, exploded view of a backlight module according to a fifth embodiment of the present invention.

Referring to FIG. 16, a backlight module 600 according to a fifth embodiment of the present invention is similar to the backlight module 200, differing only in that the two ends of a light source 620 are cut to step-shapes. Correspondingly, each end of a light incident surface 612 of a light guide panel 610 extends a step-shaped block 618 to engage the light source 620.

Figure 17:
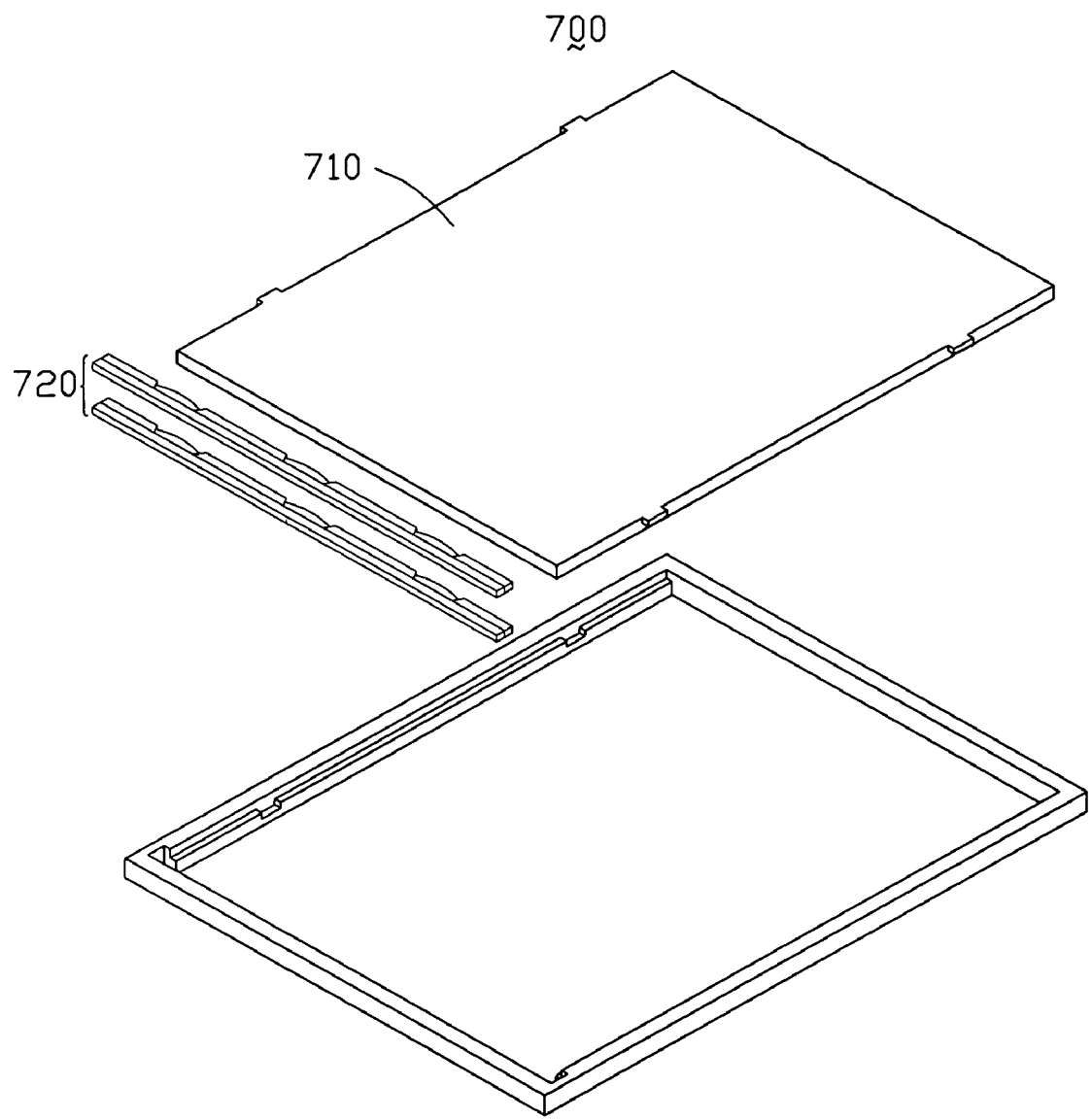
FIG. 17 is similar to FIG. 11, but shows an isometric, exploded view of a backlight module according to a sixth embodiment of the present invention.

Referring to FIG. 17, a backlight module 700 according to a sixth embodiment of the present invention is similar to the backlight module 200, differing only in that the a light source 720 includes two stacked light sources 20.

Figure 18:
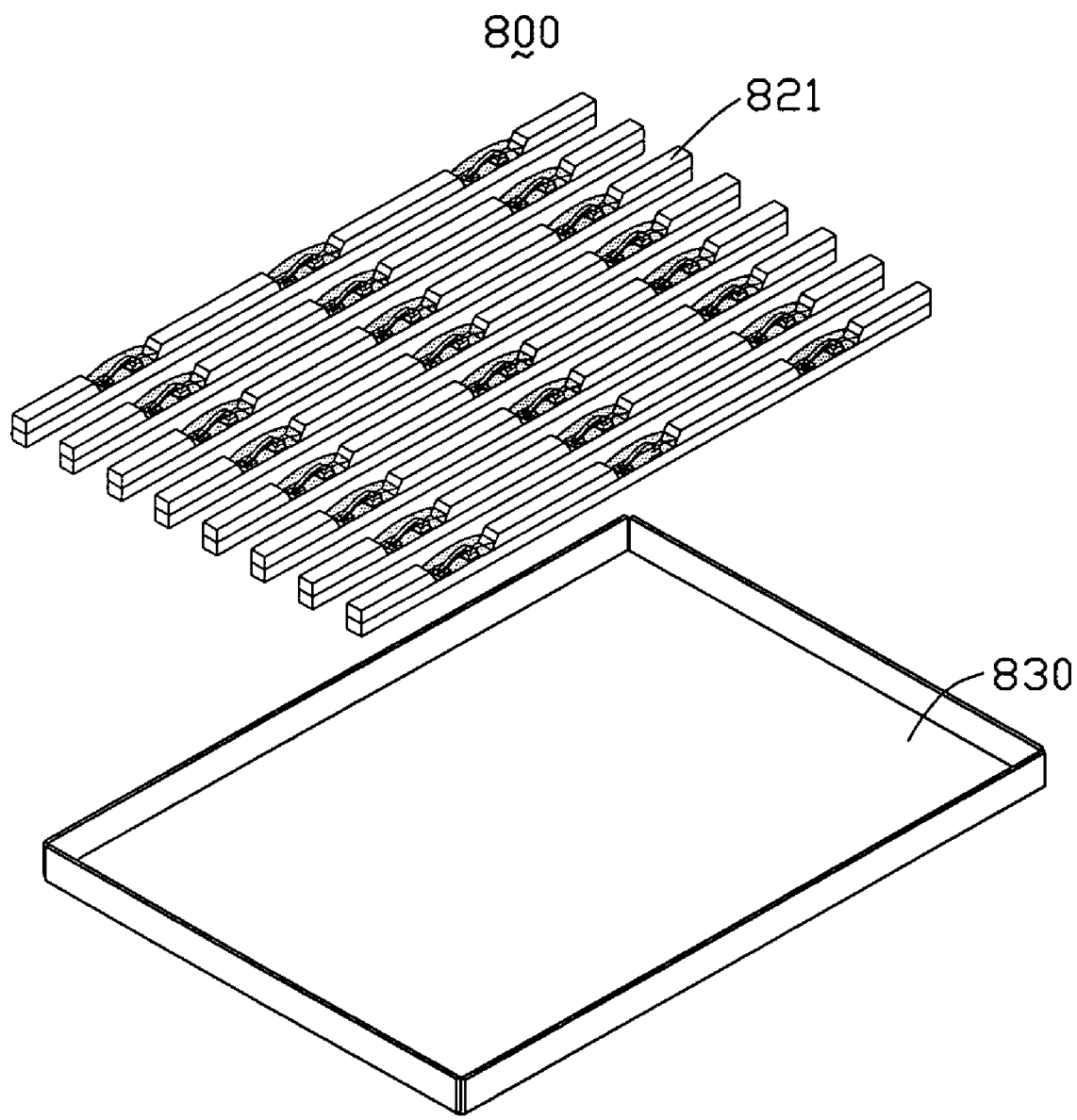
FIG. 18 is an isometric view of a direct backlight module according to a seventh embodiment of the present invention.

Referring to FIG. 18, an isometric view of a backlight module 800 according to a seventh embodiment of the present invention is shown. The backlight module 800 is a direct backlight module. The backlight module 800 includes a plurality of linear light source 821 and a frame 830 for receiving the light sources 821. The light source 821 adopts the light source 20.

Figure 19:
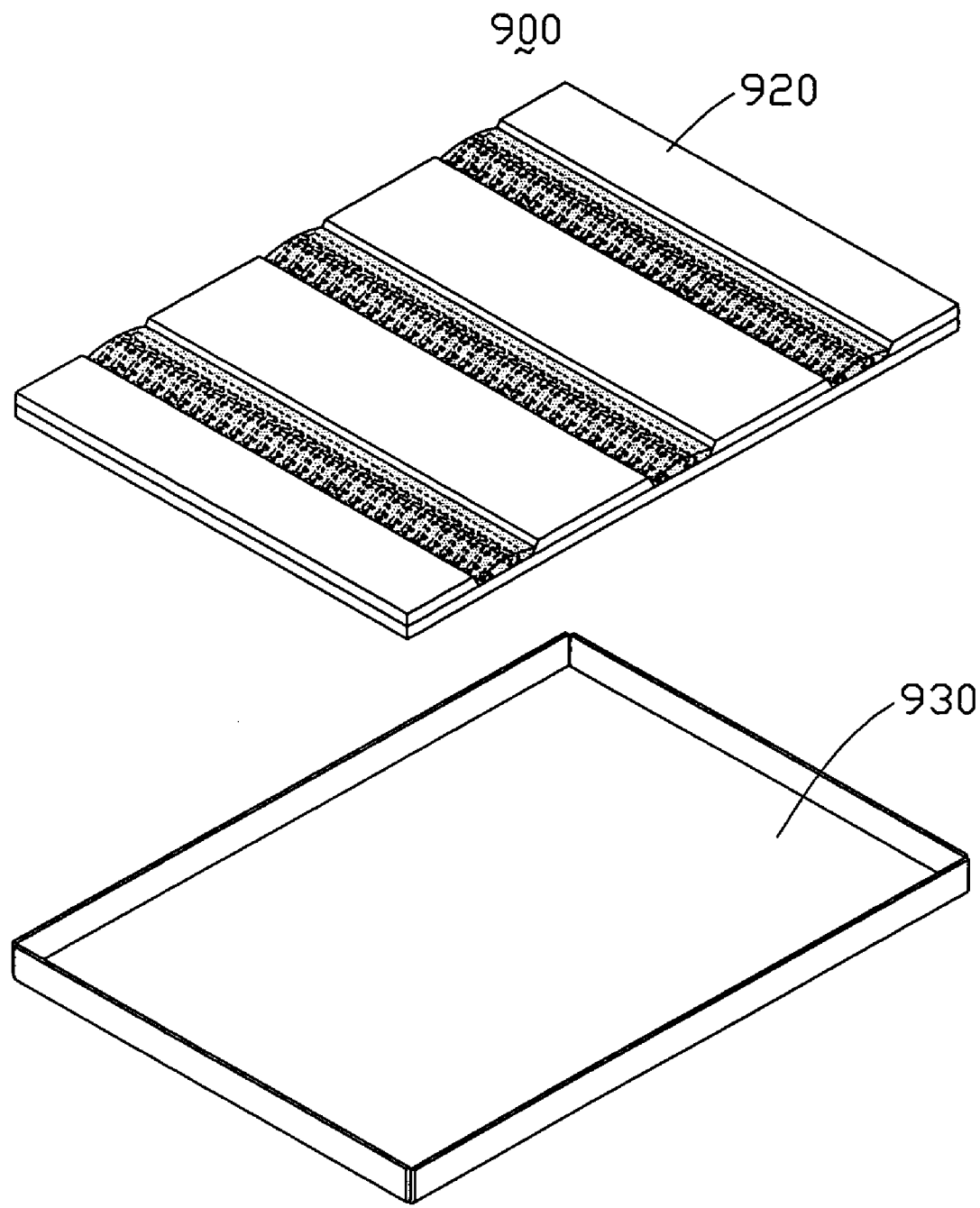
FIG. 19 is an isometric view of a direct backlight module according to an eighth embodiment of the present invention.
Figure 20:
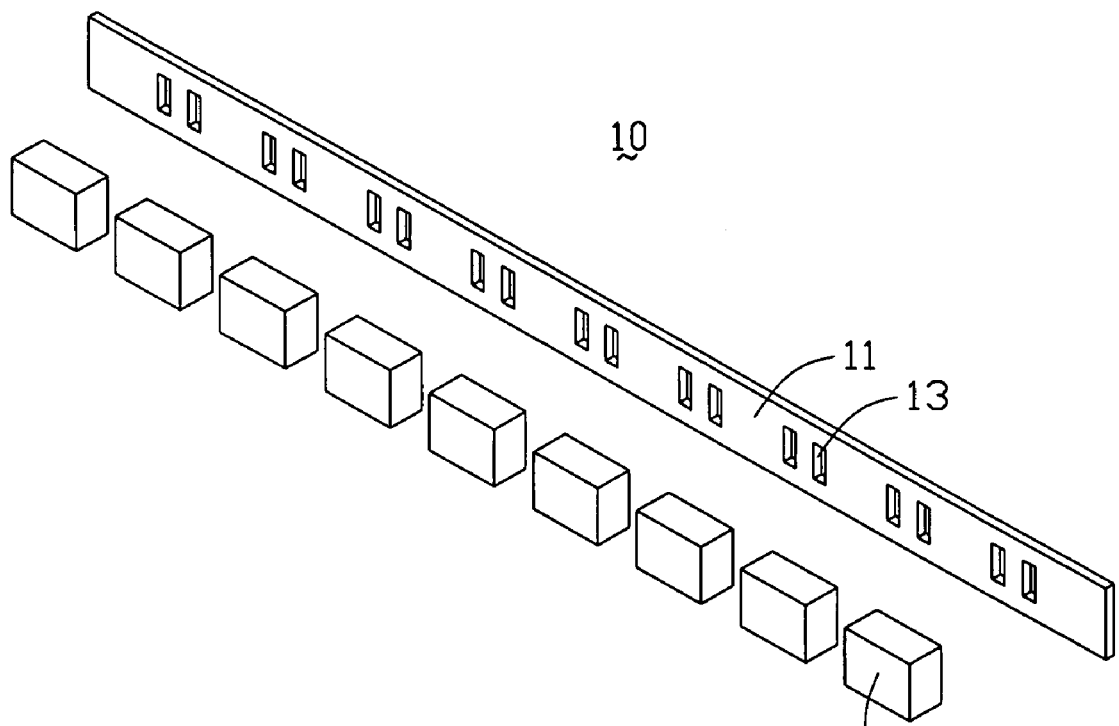
FIG. 20 is an isometric view of a conventional light source, which includes a plurality of LEDs.
Figure 21:
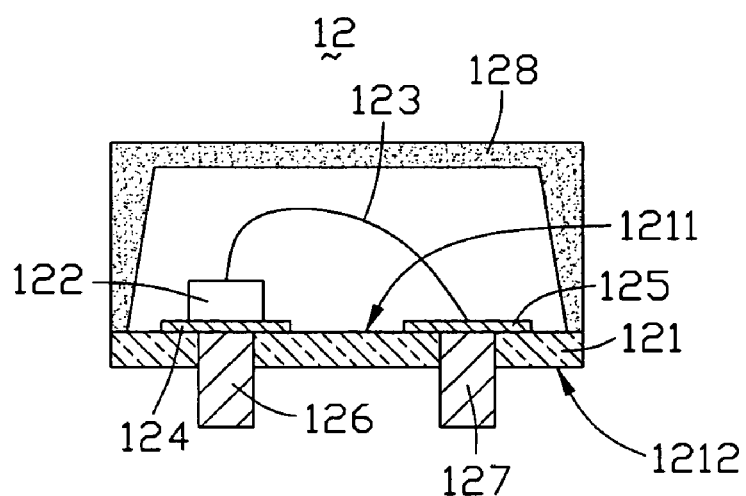
FIG. 21 is a cross-section of the LED of FIG. 20.

Referring to FIG. 19, an isometric view of a backlight module 900 according to an eighth embodiment of the present invention is shown. The backlight module 900 is a direct backlight module. The backlight module 800 includes a planar light source 920 and a frame 930 receiving the light sources 920. The light source 920 adopts the light source 30.

Unlike conventional backlight modules, light sources for backlight modules 200 to 900 (from the first to the eighth embodiments) have structures similar to those of the light sources 20 or 30, thicknesses and volumes of the backlight modules 200 to 900 are decreased. Furthermore, structures and manufacturing process of the backlight modules 200 to 900 are simplified.

In further and/or alternative embodiments, light source 720 can be cut from the planar light source 30, but as wide as two stacked linear light sources 20, rather than two independent linear light sources 20.

It is to be understood, however, that even though numerous characteristics and advantages of the present embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A backlight module, comprising a light source,
   the light source comprising:
   a substrate;
   a plurality of blocks disposed on the substrate, the blocks spaced from each other; and
   a plurality of light emitting diodes (LEDs), each comprising a first electrode, a second electrode, a chip, and a bonding wire, the first and second electrodes arranged on the substrate between two blocks, and electrically connected to each other via the chip and the bonding wire;
   a light guide panel to transform linear light to planar light; and
   a frame to receive the light source, each of two adjacent corners of the frame being step-shaped or wedge-shaped, with two ends of the light source correspondingly cut into step or wedge shapes to engage the frame.

2. The backlight module of claim 1, wherein only one LED is disposed between two blocks so that the light source is a linear light source.

3. A backlight module, comprising a light source,
   the light source comprising:
   a substrate;
   a plurality of blocks disposed on the substrate, the blocks spaced from each other; and
   a plurality of light emitting diodes (LEDs), each comprising a first electrode, a second electrode, a chip, and a bonding wire, the first and second electrodes arranged on the substrate between two blocks, and electrically connected to each other via the chip and the bonding wire;
   a light guide panel to transform linear light to planar light; and
   a frame to receive the light source, each end of a light incident surface of the light guide panel having a step-shaped or wedge-shaped block extending therefrom, and correspondingly, two ends of the light source being cut into step or wedge shapes to engage the light guide panel.

4. The backlight module of claim 3, wherein only one LED is disposed between two blocks so that the light source is a linear light source.

* * * * *